(12) United States Patent
Watanabe et al.

(10) Patent No.: US 9,405,123 B2
(45) Date of Patent: Aug. 2, 2016

(54) OPTICAL SYSTEM

(71) Applicant: Sumita Optical Glass, Inc., Saitama, Saitama (JP)

(72) Inventors: Hiroki Watanabe, Saitama (JP); Kazuya Aida, Saitama (JP)

(73) Assignee: Sumita Optical Glass, Inc., Saitama, Saitama (JP)

( * ) Notice: Subject to any disclaimer, the term of this patent is extended or adjusted under 35 U.S.C. 154(b) by 0 days.

(21) Appl. No.: 14/736,478

(22) Filed: Jun. 11, 2015

(65) Prior Publication Data

US 2015/0370019 A1    Dec. 24, 2015

(30) Foreign Application Priority Data

Jun. 24, 2014  (JP) ................. 2014-129393

(51) Int. Cl.
| | |
|---|---|
| *G02B 6/32* | (2006.01) |
| *G02B 27/09* | (2006.01) |
| G02B 19/00 | (2006.01) |
| G02B 3/00 | (2006.01) |
| H01S 5/40 | (2006.01) |
| G02B 6/42 | (2006.01) |
| H01S 3/094 | (2006.01) |
| H01S 3/0941 | (2006.01) |

(52) U.S. Cl.
CPC ........ *G02B 27/0922* (2013.01); *G02B 19/0014* (2013.01); *G02B 27/0961* (2013.01); *G02B 3/005* (2013.01); *G02B 6/4206* (2013.01); *G02B 19/0057* (2013.01); *H01S 3/09415* (2013.01); *H01S 3/094003* (2013.01); *H01S 5/4012* (2013.01)

(58) Field of Classification Search
CPC .......... G02B 27/0922; G02B 27/0961; G02B 19/0014
See application file for complete search history.

(56) References Cited

U.S. PATENT DOCUMENTS

| | | | |
|---|---|---|---|
| 4,839,314 A * | 6/1989 | Boudot | ................... C03C 3/068 501/78 |
| 5,787,107 A | 7/1998 | Leger et al. | |
| 6,407,870 B1 | 6/2002 | Hurevich et al. | |
| 6,462,883 B1 | 10/2002 | Wang et al. | |
| 7,339,975 B2 * | 3/2008 | Yamanaka | ......... G02B 27/0961 372/101 |
| 2005/0232628 A1 | 10/2005 | Von Freyhold et al. | |

FOREIGN PATENT DOCUMENTS

JP    2011-076092 A    4/2011

OTHER PUBLICATIONS

Aug. 19, 2015, Extended European Search Report issued by the European Patent Office in the corresponding European Patent Application No. 15173146.0.

* cited by examiner

*Primary Examiner* — Omar R Rojas
(74) *Attorney, Agent, or Firm* — KENJA IP LAW PC

(57) ABSTRACT

To provide an optical system that lengthens the lifetime of a fiber, an optical system 13 guides light beams emitted from a plurality of light emitting parts ep into a single optical fiber 12, the plurality of light emitting parts ep are arranged to be aligned along a first direction d1, and the optical system 13 allows the light beams emitted from the plurality of light emitting parts ep to have different light collection centers which are offset from each other at least in a second direction d2.

13 Claims, 7 Drawing Sheets

OPTICAL SYSTEM

TECHNICAL FIELD

This disclosure relates to an optical system that guides light beams emitted from a plurality of light emitting parts into an optical fiber.

BACKGROUND

Fiber lasers are known as a kind of solid-state laser. Such a fiber laser has a variety of advantages such as good process quality due to its fine light emitting point, good usability, and good maintainability due to its capacity to use a semiconductor laser as an excitation light source. In response to recent demands for a high output-power fiber laser, excitation light of high intensity may be introduced into the fiber. However, there is limitation on the increase in the output power of the excitation light emitted from a single light emitting point of the semiconductor laser used as the excitation light source. One proposed solution to the above involves the collection of light beams emitted from a plurality of light emitting points into the fiber (Refer to Patent Literature 1).

CITATION LIST

Patent Literature

PTL 1: JP2011076092A

SUMMARY

However, Patent Literature 1 fails to consider the lifetime of the disclosed device, and a longer lifetime of such a device has been required.

This disclosure is based on the aforementioned viewpoint. It would be helpful to provide an optical system that is capable of lengthening the lifetime of the fiber, which is one of components of the fiber laser device.

A first aspect of this disclosure in view of the aforementioned problems resides in an optical system, wherein a light beam emitted from each of a plurality of light emitting parts arranged to be aligned along a first direction to the optical system enters a single optical fiber, with the respective light beams emitted from the plurality of light emitting parts having different light collection centers which are offset from each other at least in a second direction that is orthogonal to the first direction.

A second aspect of this disclosure resides in the optical system, including: an emission surface that is designed to be located closest to the optical fiber and that, preferably refracts the light beam emitted from each of the plurality of light emitting parts into a different orientation in the second direction.

A third aspect of this disclosure resides in the optical system, wherein the emission surface preferably includes a lens array including a plurality of lens elements arranged to be aligned along the first direction.

A fourth aspect of this disclosure resides in the optical system, wherein, when viewed from the second direction, two adjacent lens elements in the plurality of lens elements are preferably continuous in a direction that is orthogonal to each of the first direction and the second direction.

A fifth aspect of this disclosure resides in the optical system, wherein the plurality of lens elements, except for any one of the plurality of lens elements, preferably have optical axes that are eccentric to an optical axis of the any one of the plurality of lens elements in the second direction.

A sixth aspect of this disclosure resides in the optical system, wherein the plurality of lens elements, except for any one of the plurality of lens elements, preferably have optical axes that are inclined from an optical axis of the any one of the plurality of lens elements with respect to a straight line extending in parallel to the first direction A seventh aspect of this disclosure resides in the optical system, wherein the emission surface preferably includes a toroidal surface portion having an arcuate section orthogonal to the first direction.

An eighth aspect of this disclosure resides in the optical system, wherein the emission surface preferably includes an aspheric surface.

A ninth aspect of this disclosure resides in the optical system, wherein the plurality of lens elements preferably collect the respective light beams emitted from the plurality of light emitting parts in the first direction and emit the collected light beams to the single optical fiber.

A tenth aspect of this disclosure resides in the optical system, wherein the plurality of lens elements, except for any one of the plurality of lens elements, preferably have optical axes that are eccentric to an optical axis of the any one of the plurality of lens elements in the first direction.

An eleventh aspect of this disclosure resides in the optical system, wherein the plurality of lens elements, except for any one of the plurality of lens elements, preferably have optical axes that are inclined from an optical axis of the any one of the plurality of lens elements with respect to a straight line extending in parallel to the second direction A twelfth aspect of this disclosure resides in the optical system, including: an incident surface that is designed to be located closest to the plurality of light emitting parts and that, preferably includes a lens array including a plurality of lens elements arranged to be aligned along the first direction.

A thirteenth aspect of this disclosure resides in the optical system, including: an incident surface that is designed to be located closest to the plurality of light emitting parts and that, preferably includes a toroidal surface portion having an arcuate section orthogonal to the first direction.

A fourteenth aspect of this disclosure resides in the optical system, including: an incident surface that is designed to be located closest to the plurality of light emitting parts and that, preferably includes an aspheric or a spherical surface.

A fifteenth aspect of this disclosure resides in the optical system preferably made of a glass material having a refractive index of greater than or equal to 1.7.

The optical system according to this disclosure is capable of lengthening the lifetime of the fiber used in the fiber laser.

DETAILED DESCRIPTION

Embodiments will be described below with reference to the drawings.

Figure 1:
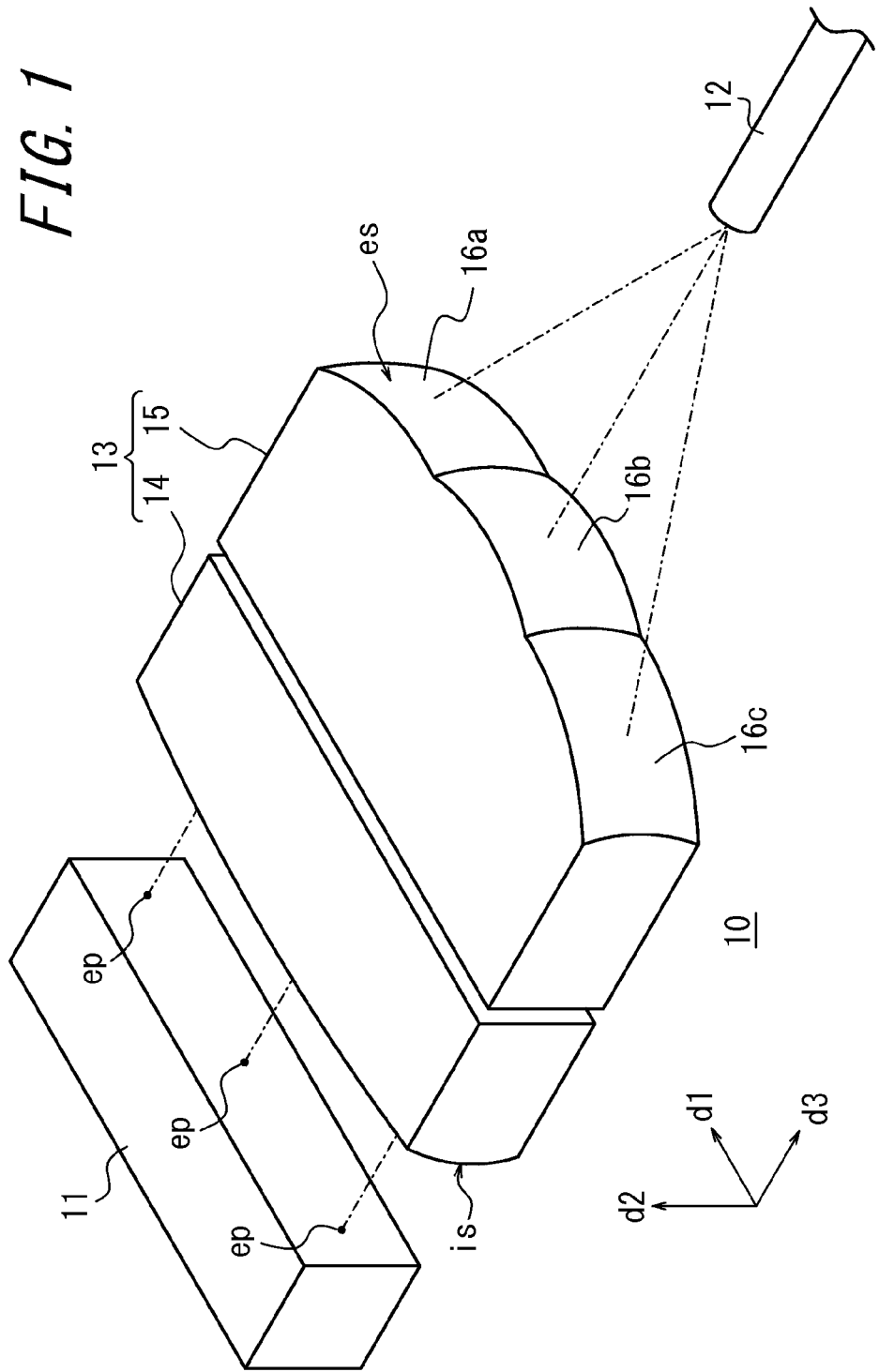
FIG. 1 is an appearance view schematically illustrating a structure of a fiber laser device including an optical system according to a first embodiment.

FIG. 1 is an appearance view schematically illustrating a fiber laser device including an optical system according to a first embodiment.

The fiber laser device 10 includes a light source unit 11, an optical fiber 12, and an optical system 13. The light source unit 11 emits light which is excited. The optical fiber 12 undergoes laser oscillation by the emitted light. The optical system 13 guides the light emitted from the light source unit 11 to the optical fiber 12. In the fiber laser device 10, a first direction d1, a second direction d2, and a third direction d3, which are orthogonal to each other, are defined.

The light source unit 11 includes a plurality of, e.g., three in the present embodiment, light emitting parts ep arranged along any single direction, and each light emitting part ep emits a light beam. The light source unit 11 including the plurality of light emitting parts ep may be a laser bar including light emitting parts ep arranged along any single direction. The light source unit 11 may also be configured by a plurality of laser chips arranged along any single direction. The light source unit 11 is arranged in a manner such that a direction that the light emitting parts ep are arranged is parallel with the first direction d1.

The optical fiber 12 has, for example, a double clad structure with a rare earth element-doped core, and light, after entering the first clad and the core, is propagated in the optical fiber 12 while being reflected by an interface between the first clad and the second clad. The light is partly absorbed in the core while being propagated between both ends. By the light partially absorbed, the doped rare earth element is excited, thereby causing laser oscillation in the optical fiber 12.

The optical system 13 is made of a glass material having a refractive index of greater than or equal to 1.7 and includes a first optical element 14 and a second optical element 15. The first optical element 14 and the second optical element 15 may be arranged with space therebetween. However, the optical system 13 may also be configured to include the first optical element 14 and the second optical element 15 that are integrated.

The first optical element 14 includes an incident surface is that is designed to be located closest to the light emitting parts ep in the optical system 13. The incident surface is generally or partially includes a toroidal surface portion. The arcuate toroidal surface portion of the first optical element 14 has two sections that are orthogonal to each other and that have a small and a large radius of curvature. The first optical element 14 is arranged in a manner such that the section having the small radius of curvature is orthogonal to the first direction d1, and the section having the large radius of curvature is orthogonal to the second direction d2.

Figure 2:
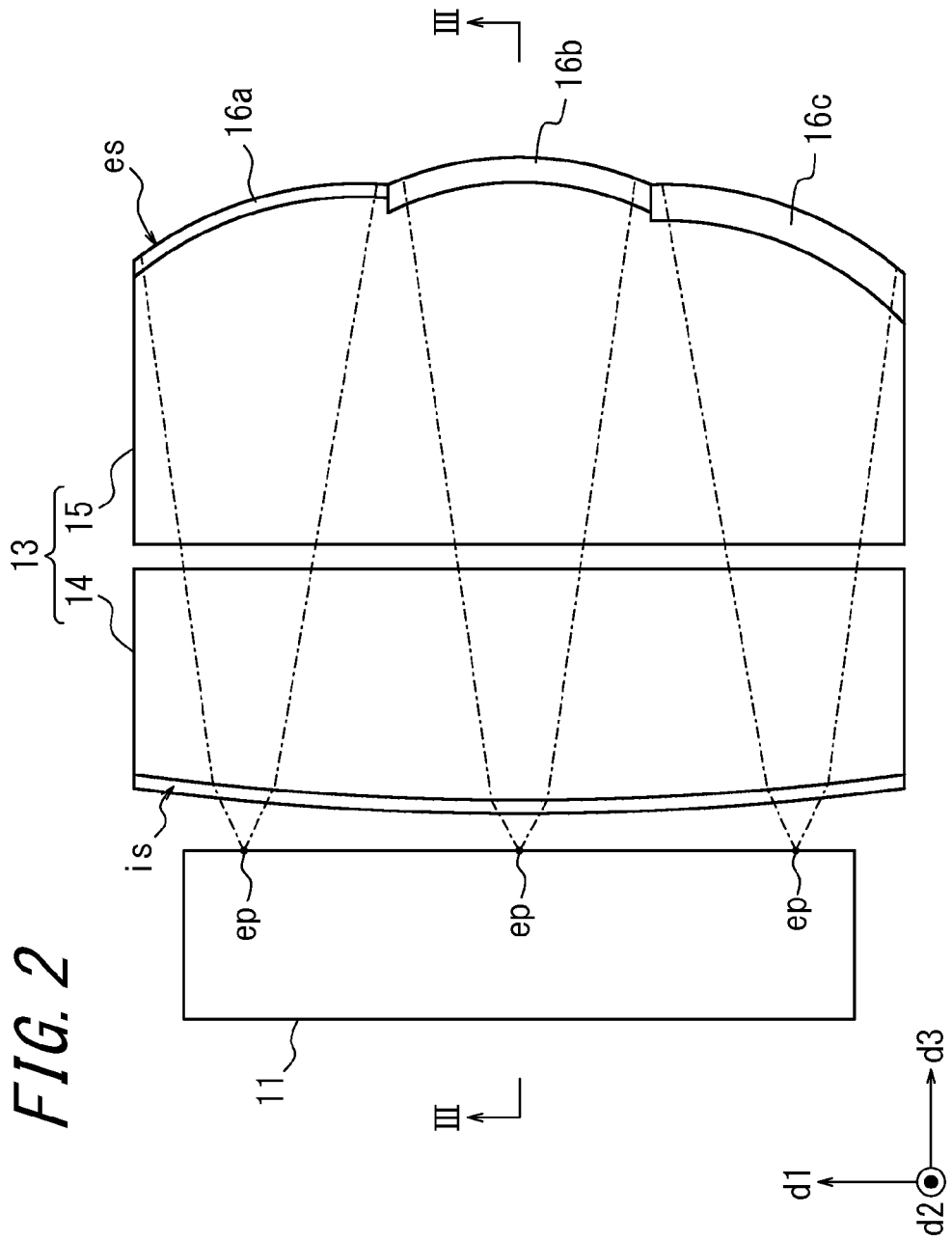
FIG. 2 is a plan view of a light source unit and the optical system illustrated in FIG. 1.
Figure 3:
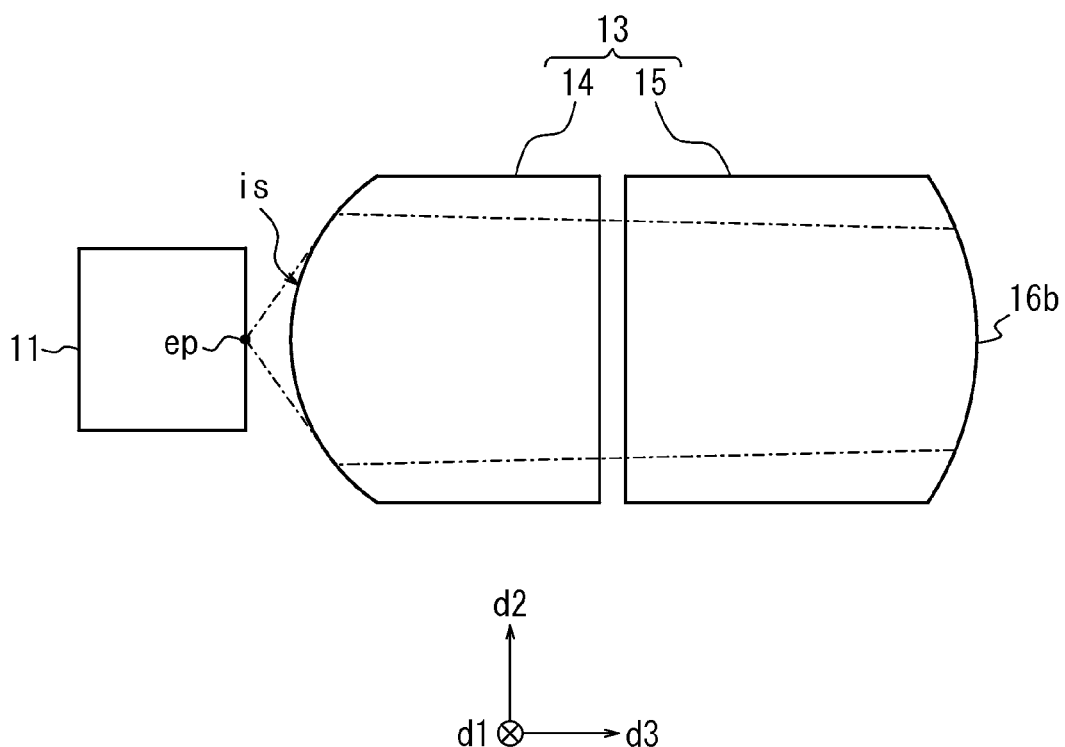
FIG. 3 is a sectional view taken along a line III-III in FIG. 2.

As illustrated in FIG. 2, the incident surface is of the first optical element 14 is configured to collect light beams emitted from the light emitting parts ep in a surface constituting lens elements 16a, 16b, and 16c disposed in correspondence with the light emitting parts ep, in the first direction d1. The lens elements 16a, 16b, and 16c are later described. Furthermore, as illustrated in FIG. 3, the incident surface is of the first optical element 14 is configured to collect light beams emitted from the light emitting parts ep in the surface constituting the corresponding lens elements 16a, 16b, and 16c, in the second direction d2.

The second optical element 15 includes an emission surface es that is designed to be located closest to the optical fiber 12 in the optical system 13 (refer to FIG. 1). The emission surface es includes a plurality of, e.g., three in the present embodiment, lens elements 16a, 16b, and 16c arranged along any single direction. The number of the lens elements is greater than or equal to that of the light emitting parts ep. The lens elements 16a, 16b, and 16c emit the light beams which have entered the first optical element 14 toward the optical fiber 12. The plurality of lens element 16a, 16b, and 16c are arranged to be aligned along the first direction d1 in the second optical element 15. The lens elements 16a, 16b, and 16c are each formed in a toroidal shape, and the emission surface es has a toroidal surface portion. The arcuate toroidal surface of each of the lens elements 16a, 16b, and 16c has two sections that are orthogonal to each other, and the lens elements 16a, 16b, and 16c are arranged in a manner such that these sections are orthogonal to the first direction d1 and the second direction d2.

Figure 4:
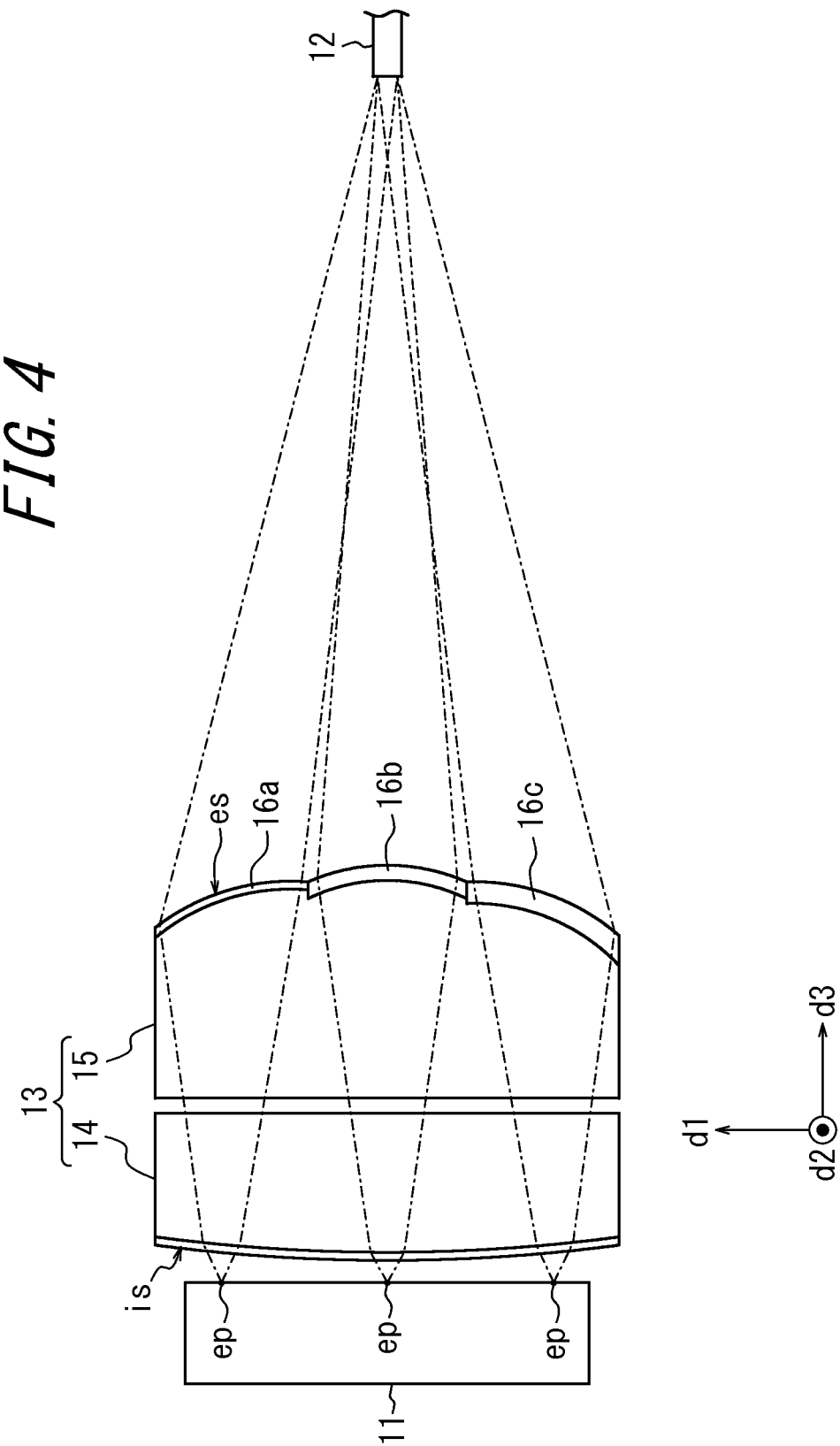
FIG. 4 is a plan view of the fiber laser device of FIG. 1, illustrating, along a first direction, a state where light beams are collected according to the optical system illustrated in FIG. 1.

As illustrated in FIG. 4, the lens elements 16a, 16b, and 16c are configured to collect light beams emitted from the corresponding light emitting parts ep in the first direction d1 and to emit the collected light beams to the single optical fiber 12 located at a predetermined distance from the emission surface es. In order to emit the light beams to the optical fiber 12, the lens elements (e.g., the lens elements 16a and 16c), except for any one of the lens elements 16a, 16b, and 16c (e.g., the lens element 16b that is located in the middle in the first direction d1), are configured to have optical axes that are eccentric to that of the any one of the lens elements (e.g., the lens element 16b) in the first direction d1. Alternatively, in order to emit the light beams to the optical fiber 12, the lens elements (e.g., the lens elements 16a and 16c), except for any one of the lens elements 16a, 16b, and 16c (e.g., the lens element 16b), are configured to have optical axes that are inclined from that of the any one of the lens elements (e.g, the lens element 16b) with respect to a straight line extending in parallel to the second direction.

Additionally, the light beams may be collected by the optical system 13 in the first direction d1, not always in a single point, but within a certain width range, and moreover, this width may be greater than the diameter of the first clad included in the optical fiber 12. Moreover, in the first direction d1, the light collection range does not necessarily be identical for each light beam.

Figure 5:
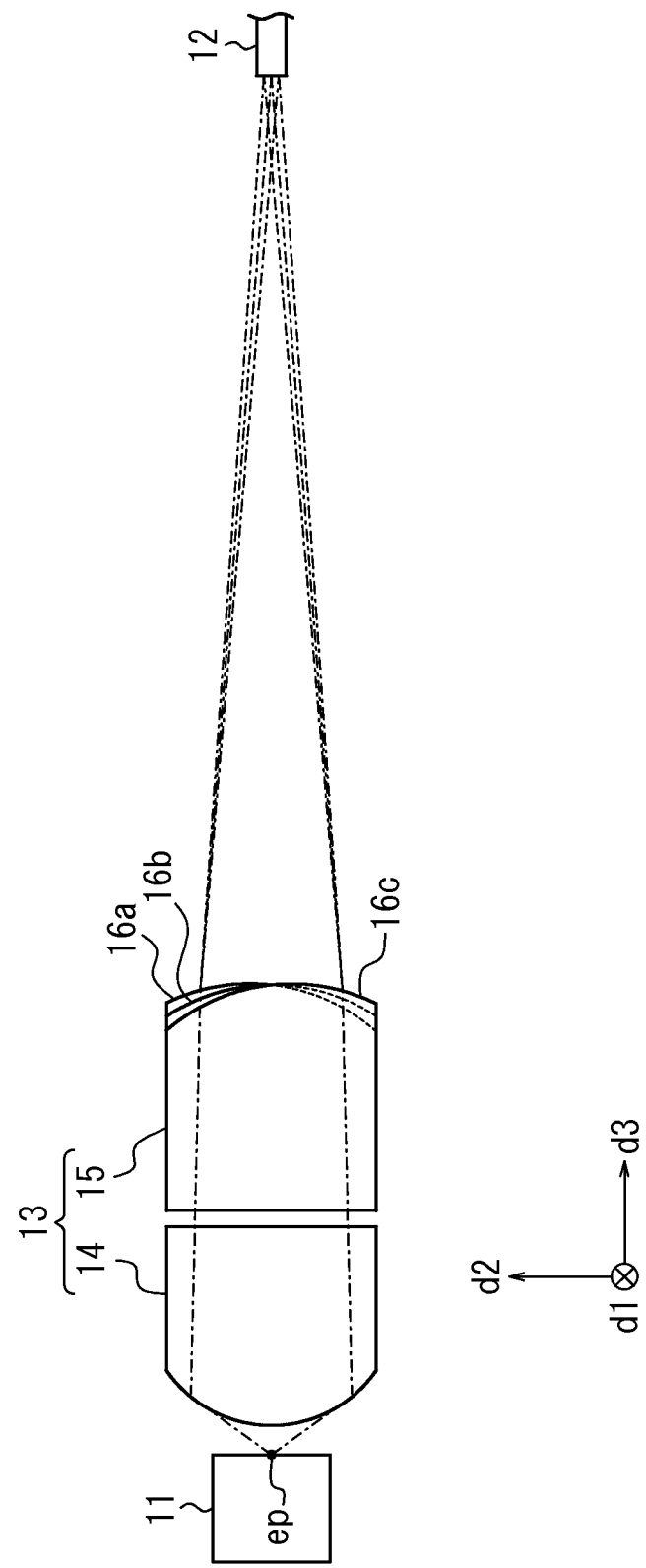
FIG. 5 is a side view of the fiber laser device of FIG. 1, illustrating, along a second direction, a state where light beams are collected according to the optical system illustrated in FIG. 1.
Figure 6:
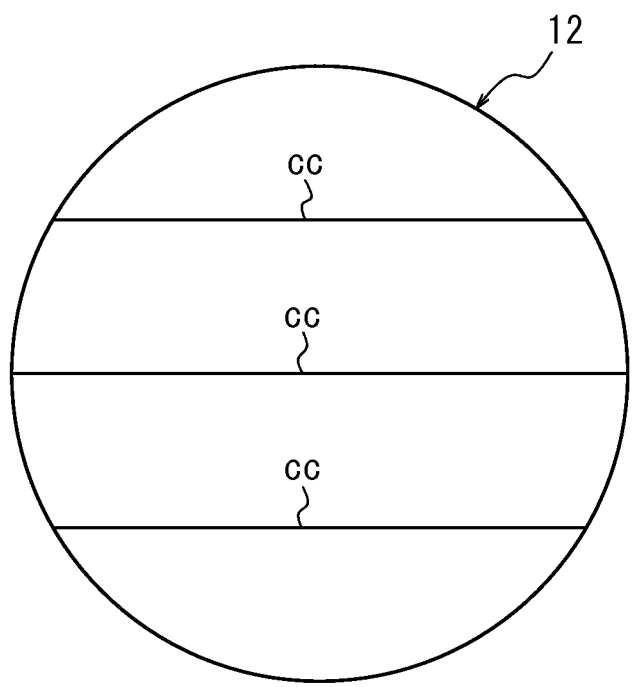
FIG. 6 is a front view of an incidence surface of the optical fiber of FIG. 1, illustrating, along a second direction, a state where light beams are collected according to the optical system of FIG. 1.

As illustrated in FIG. 5, the lens elements 16a, 16b, and 16c are each configured to collect the light beam emitted from the corresponding light emitting part ep and to emit the collected light beam to the single optical fiber 12 located at the predetermined distance, with the respective light beams emitted from the light emitting parts ep having different light collection centers cc which are offset from each other in the second direction d2 (refer to FIG. 6). In order for the light beams to be emitted to the optical fiber 12 at the different light collection centers cc which are offset from each other, the lens elements 16a, 16b, and 16c are each configured to refract the light beam from the corresponding light emitting part ep into a different orientation in the second direction d2 (refer to FIG. 5). For example, the lens elements (e.g., the lens elements 16a and

16*c*), except for any one of the lens elements 16*a*, 16*b*, and 16*c* (e.g., the lens element 16*b* that is located in the middle in the first direction d1), are configured to have optical axes that are eccentric to that of the any one of the lens elements (e.g., the lens element 16*b*) in the second direction d2. Alternatively, the lens elements (e.g., the lens elements 16*a* and 16*c*), except for any one of the lens elements 16*a*, 16*b*, and 16*c* (e.g., the lens element 16*b*), are configured to have optical axes that are inclined from that of the any one of the lens elements (e.g, the lens element 16*b*) with respect to a straight line extending in parallel to the first direction d1.

Furthermore, as illustrated in FIG. 2, as viewed from the second direction d2, the emission surface es is formed to maintain continuity of two adjacent lens elements (16*a* and 16*b*) and (16*b* and 16*c*) in the third direction d3, which is orthogonal to each of the first direction d1 and the second direction d2.

The optical system according to the first embodiment with the above structures emits the light beams from the plurality of light emitting parts ep to the single optical fiber 12 while allowing the light collection centers cc of the light beams to be offset from each other in the second direction d2. As a result, the light beams are prevented from entering the optical fiber at a single point. This prevents deterioration of the incident surface is of the optical fiber 12 due to light beams focused on a single point, and accordingly, the lifetime of the optical fiber 12 is lengthened.

Moreover, in the optical system according to the first embodiment, two lens elements (16*a* and 16*b*) and (16*b* and 16*c*) that are adjacent to each other are contiguous in the third direction d3 when viewed from the second direction d2. As a result, a difference in level between each two adjacent lens elements, such as between (16*a*) and (16*b*) and between (16*b*) and (16*c*), is relatively small. Such small differences in level of two adjacent lens elements (16*a* and 16*b*) and (16*b* and 16*c*) provide the following advantageous effect in injection molding of the optical system 13. Generally, in injection molding, as differences in level of two adjacent lens elements increase, larger molding loads are required in order to fill the stepped portions with glass, and the more likely it is that the metal mold will be deteriorated. Such a metal mold also generally uses, as its material, tungsten carbide and ceramic having relatively low tenacities and is susceptible to chipping in the presence of such differences in level. Accordingly, the present embodiment with the relatively small differences in step is capable of preventing the deterioration of the metal mold in injection molding of the optical system 13.

Moreover, the optical system according to the first embodiment is configured by the optical system 13 using the glass material having a refractive index of greater than or equal to 1.7. As a result, even when the radius of curvature of the incident surface is of the first optical element 14 measured in a section taken along the plane that is orthogonal to each of the first direction d1 and the second direction d2 is increased, the light beams are sufficiently collected. The increased radius of curvature also facilitates manufacturing of the optical system 13.

In the following, a description is given of the optical system according to a second embodiment. In the optical system according to the second embodiment, structures of the incident surface of the first optical element and the emission surface of the second optical element differ from those according to the first embodiment. The description of the second embodiment below focuses on the differences from the first embodiment. Elements having substantially the same structures as in the first embodiment are designated by the same reference numerals.

Figure 7:
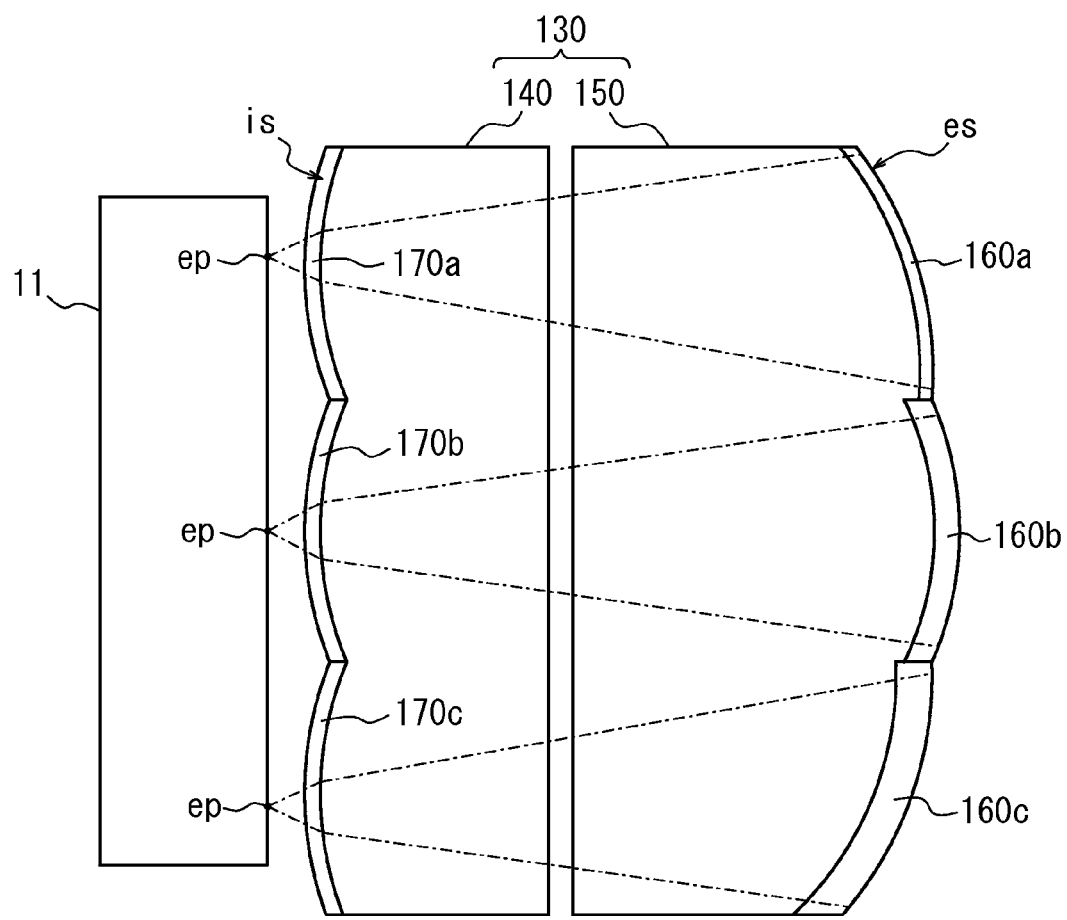
FIG. 7 is a plan view of a light source unit and an optical system according to a second embodiment.

Similarly to the first embodiment, the optical system 130 in the second embodiment is made of a glass material having a refractive index of greater than or equal to 1.7 and includes a first optical element 140 and a second optical element 150 as illustrated in FIG. 7. The first optical element 140 and the second optical element 150 may be arranged with space therebetween. However, the optical system 130 may also be configured to include the first optical element 140 and the second optical element 150 that are integrated.

The incident surface is of the first optical element 140 includes a plurality of, e.g., three in the present embodiment, lens elements 170*a*, 170*b*, and 170*c* arranged along the first direction d1. The number of the lens elements is greater than or equal to that of the light emitting parts ep. The lens elements 170*a*, 170*b*, and 170*c* included in the incident surface is are each formed in an aspheric shape, and the incident surface is has an aspheric surface. The lens elements 170*a*, 170*b*, and 170*c* included in the incident surface is are each positioned with its optical axis orthogonal to the first direction d1. The lens elements 170*a*, 170*b*, and 170*c* included in the incident surface is are configured to collect light beams emitted from the light emitting parts ep in a surface constituting lens elements 160*a*, 160*b*, and 160*c* included in the emission surface es that are disposed in correspondence with the light emitting parts ep, in the first direction d1 and the second direction d2.

Similarly to the first embodiment, the second optical element 150 includes the emission surface es that is designed to be located closest to the optical fiber 12 in the optical system 130. Similarly to the first embodiment, the emission surface es includes the plurality of, e.g., three in the present embodiment, lens elements 160*a*, 160*b*, and 160*c* arranged along any single direction. The number of the lens elements is greater than or equal to that of the light emitting parts ep.

The plurality of lens element 160*a*, 160*b*, and 160*c* are arranged to be aligned along the first direction d1 in the second optical element 150. The lens elements 160*a*, 160*b*, and 160*c* are each formed in an aspheric shape. The aspheric surfaces of the lens elements 160*a*, 160*b*, and 160*c* are configured to collect light beams emitted from the corresponding light emitting parts ep in the first direction d1 and to emit the collected light beams to the single optical fiber 12 located at a predetermined distance from the emission surface es. The aspheric surfaces of the lens elements 160*a*, 160*b*, and 160*c* are also configured to emit the light beams from the plurality of light emitting parts ep to the single optical fiber 12 located at the predetermined distance while allowing the light collection centers cc of the light beams to be offset from each other in the second direction d2.

The optical system according to the second embodiment with the above structures also prevents the light beams from being guided to a single point in the optical fiber 12 in the second direction d2, and accordingly, the lifetime of the optical fiber 12 is lengthened. Furthermore, in the optical system according to the second embodiment also, as viewed from the second direction d2, the incident surface is and the emission surface es may be formed to maintain continuity of two adjacent lens elements (160*a* and 160*b*), (160*b* and 160*c*), (170*a*, 170*b*), and (170*b*, 170*c*) in the third direction d3. As a result, a difference in level of each two adjacent lens elements, such as between (160*a*) and (160*b*), between (160*b*) and (160*c*), between (170*a*) and (170*b*), and between (170*b*) and (170*c*), is relatively small, and this prevents the deterioration of the metal mold in injection molding of the optical system 130. Moreover, the optical system according to the second embodiment is configured by the optical system 130 using the glass material having a refractive index of greater than or equal to 1.7. As a result, even when the incident surface is of the first optical element 140 is formed in a planar shape, the light beams are sufficiently collected.

Although the description herein has been given with reference to the drawings and embodiments, it should be noted that those skilled in the art may make various changes and modifications on the basis of this disclosure without difficulty. Accordingly, any such changes and modifications are intended to be included in the scope of the embodiments.

For example, although in the second embodiment the incident surface includes an aspheric surface, the incident surface may also include a spherical or a planar surface. When the incident surface includes a planar surface, the emission surface es may collect, in the surface constituting the lens elements 160*a*, 160*b*, and 160*c* of the emission surface es, the light beams emitted from the corresponding light emitting parts ep. Thus, the same advantageous effect as that of the second embodiment would be achieved.

The invention claimed is:

1. An optical system configured to direct a light beam emitted from each of a plurality of light emitting parts arranged to be aligned along a first direction to a single optical fiber, comprising
   an optical element having an emission surface that is designed to be located closest to the optical fiber,
   wherein the emission surface includes a lens array including a plurality of lens elements that are arranged to be aligned along the first direction and that refract the light beam emitted from each of the plurality of light emitting parts into a different orientation in a second direction that is orthogonal to the first direction so that the respective light beams emitted from the plurality of light emitting parts have different light collection centers on the optical fiber which are offset from each other at least in the second direction.

2. The optical system of claim 1, wherein,
   when viewed from the second direction, two adjacent lens elements in the plurality of lens elements are continuous in a direction that is orthogonal to each of the first direction and the second direction.

3. The optical system of claim 1, wherein
   the plurality of lens elements, except for any one of the plurality of lens elements, have optical axes that are eccentric to an optical axis of the any one of the plurality of lens elements in the second direction.

4. The optical system of claim 1, wherein
   the plurality of lens elements, except for any one of the plurality of lens elements, have optical axes that are inclined from an optical axis of the any one of the plurality of lens elements with respect to a straight line extending in parallel to the first direction.

5. The optical system of claim 1, wherein
   the emission surface includes a toroidal surface portion having an arcuate section orthogonal to the first direction.

6. The optical system of claim 1, wherein
   the emission surface includes an aspheric surface.

7. The optical system of claim 1, wherein
   the plurality of lens elements collect the respective light beams emitted from the plurality of light emitting parts in the first direction and emit the collected light beams to the single optical fiber.

8. The optical system of claim 7, wherein
   the plurality of lens elements, except for any one of the plurality of lens elements, have optical axes that are eccentric to an optical axis of the any one of the plurality of lens elements in the first direction.

9. The optical system of claim 7, wherein
   the plurality of lens elements, except for any one of the plurality of lens elements, have optical axes that are inclined from an optical axis of the any one of the plurality of lens elements with respect to a straight line extending in parallel to the second direction.

10. The optical system of claim 1, comprising:
    an incident surface that is designed to be located closest to the plurality of light emitting parts and that includes a lens array including a plurality of lens elements arranged to be aligned along the first direction.

11. The optical system of claim 1, comprising:
    an incident surface that is designed to be located closest to the plurality of light emitting parts and that includes a toroidal surface portion having an arcuate section orthogonal to the first direction.

12. The optical system of claim 1, comprising:
    an incident surface that is designed to be located closest to the plurality of light emitting parts and that includes an aspheric or a spherical surface.

13. The optical system of claim 1 made of a glass material having a refractive index of greater than or equal to 1.7.

* * * * *